United States Patent [19]

Allan

[11] Patent Number: 4,698,526

[45] Date of Patent: Oct. 6, 1987

[54] SOURCE FOLLOWER CMOS INPUT BUFFER

[75] Inventor: James D. Allan, Colorado Springs, Colo.

[73] Assignee: Inmos Corporation, Colorado Springs, Colo.

[21] Appl. No.: 788,442

[22] Filed: Oct. 17, 1985

[51] Int. Cl.⁴ .............. H03K 19/094; H03K 19/092; H03K 17/687; H03K 17/10

[52] U.S. Cl. .................... 307/475; 307/270; 307/585

[58] Field of Search ............... 307/270, 451, 475, 576, 307/579, 581, 584, 585, 304

[56] References Cited

U.S. PATENT DOCUMENTS

| | | | |
|---|---|---|---|
| 4,176,289 | 11/1979 | Leach et al. | 307/270 |
| 4,217,502 | 8/1980 | Suzuki et al. | 307/270 X |
| 4,365,172 | 12/1982 | Prater | 307/270 |
| 4,498,021 | 2/1985 | Uya | 307/443 |
| 4,549,101 | 10/1985 | Sood | 307/443 |
| 4,558,234 | 12/1985 | Suzuki et al. | 307/451 X |

OTHER PUBLICATIONS

Bansal, "Inverting/Non-Inverting On-Chip Line Driver", IBM Tech. Discl. Bull., vol. 26, No. 8, pp. 4139-4140, Jan. 1984.

Primary Examiner—Stanley D. Miller
Assistant Examiner—David R. Bertelson
Attorney, Agent, or Firm—Edward D. Manzo

[57] ABSTRACT

An input buffer has input and output inverters. An n-channel transistor is coupled as a source follower between the inverters. The buffer receives a TTL input and provides a CMOS output. The source follower transistor has a large channel width and provides substantial pullup. The output inverter stage can be made larger. A p-channel transistor in parallel with the n-channel source follower transistor permits the internal node to reach a full Vcc level. Another n-channel transistor driven by the input signal permits the node to reach ground.

20 Claims, 2 Drawing Figures

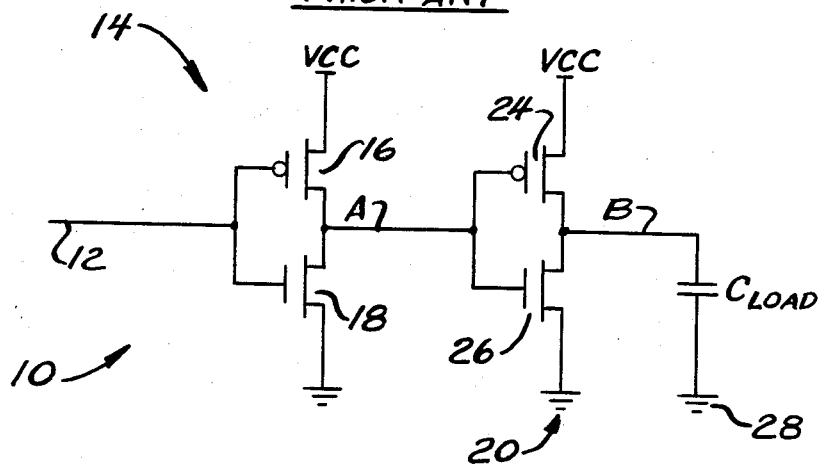
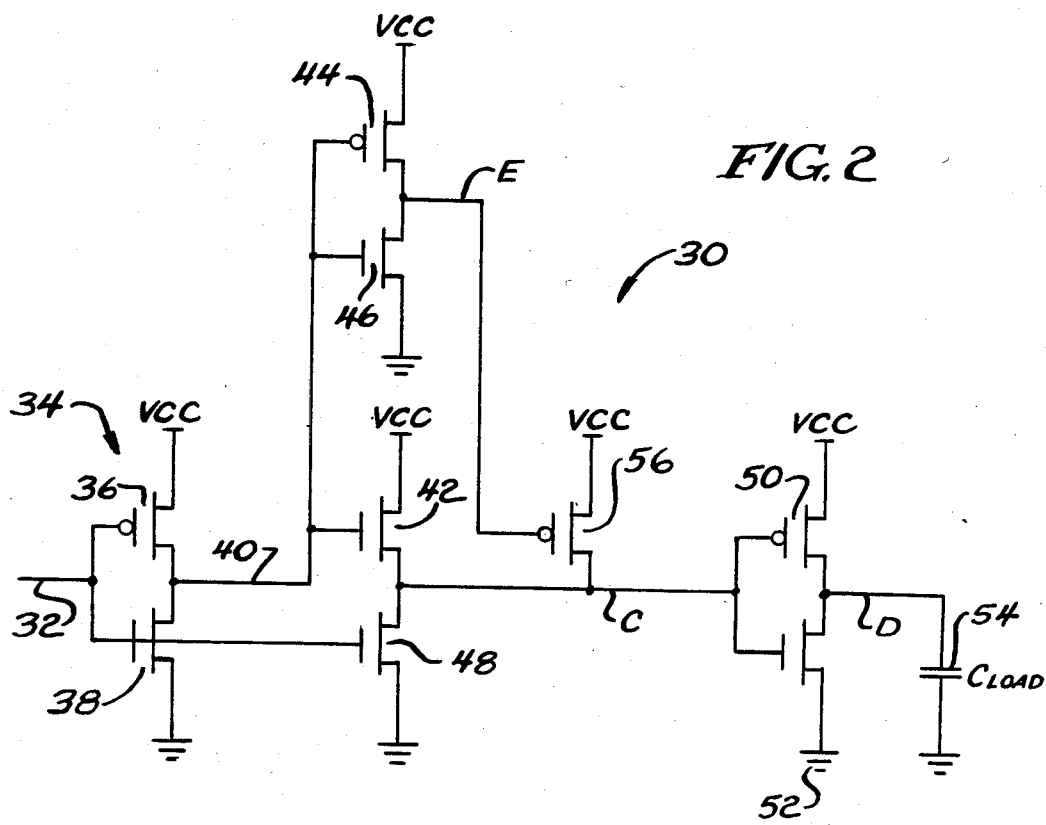

SOURCE FOLLOWER CMOS INPUT BUFFER

BACKGROUND OF THE INVENTION

The present invention relates to an input circuit for use preferably in a CMOS semiconductor memory.

An input buffer for a semiconductor memory should be able to receive a TTL input signal (being in the range of 0.8 to 2.0 volts) and generate an output signal in a voltage range corresponding to the chip (generally between VSS and VCC), which in the case of CMOS memories today is 0 volts to 5 volts. Another requirement is that the input buffer must be able to drive high internal chip capacitances.

The problem which is solved by the present invention will be understood from consideration of the conventional input buffer circuit illustrated in FIG. 1 and its shortcomings. The problem with the circuit of FIG. 1 concerns the compromise made between speed of operation and standby current. As will be explained, these have been mutually inconsistent goals, i.e. to achieve increased speed, one sacrifices standby current. The present invention overcomes this problem.

FIG. 1 shows a conventional CMOS input buffer circuit 10 formed of field effect transistors (FETs) which are all enhancement mode devices. Circuit 10 receives an input at 12 and applies it to a first inverter stage 14 comprising a CMOS pair of transistors 16, 18. Device 16 is a p-channel device, whereas device 18 is an n-channel device. The source-drain paths of transistors 16, 18 are connected in series between VCC and ground, as illustrated. Input 12 is coupled to the gate electrodes of each of these transistors. A node A between the source of transistors 16 and the drain of transistor 18 provides an input to the second stage inverter 20. Inverter 20 comprises another pair of CMOS transistors including transistors 24 and 26 connected in a fashion identical to stage 14. The output node B of stage 22 is provided to the capacitive load of the chip as represented by capacitor 28.

In FIG. 1, if the input voltage is 2.0 volts, then transistors 16 and 18 will both be turned on. Current will flow from VCC to ground through the source-drain paths of these transistors. Transistor 18 will be sized approximately four or five times larger than transistor 16 in order to insure that the voltage at node A is at or near ground when the input voltage is at a TTL logic "1" level of about 2.0 volts. In actuality, the voltage at node A may be about 1.0 volts at this condition, and as a result, some current will flow in the second stage 20. The output of inverter stage 20 will have the same logic value as input 12.

Consider that the capacity of the load is about 5 picofarads (pf). To drive this capacity, the transistors in output stage 20 will need a channel width typically of about 200 microns, using a guideline of about 40 microns per pf for an n-channel transistor. This is a fairly large transistor, and the transistors in the first stage 14 must be large because node A must drive each of transistors 24 and 26. The current through the first stage will be significant. To reduce this standby current, more inverter stages could be added. This would allow downsizing the transistors in the first stage. However, adding stages will increase the delay in the transitions in the input and the output. This undesirable result is overcome by the present invention.

SUMMARY OF THE INVENTION

The present invention in one embodiment uses a CMOS inverter input stage coupled to drive primarily an n-channel pull-up transistor connected as a source follower whose output drives a CMOS output inverter stage. A subsidiary feature of the present invention is the use of a small p-channel transistor cooperating with the n-channel source follower transistor to assure that a full VCC level is achieved at the output of the pull-up n-channel device.

The advantage of this circuit is that regardless of whether a TTL or CMOS voltage level is applied at the input, the circuit according to this invention will have low standby current. Additionally, if one allows the circuit according to the present invention to draw the same current as the circuit of FIG. 1, there will be an improvement in speed of the circuit. On the other hand, if one configures the circuit elements to achieve the same speed, a circuit according to the present invention will use about one-half the current of the circuit of FIG. 1.

BRIEF DESCRIPTION OF THE DRAWINGS

FIG. 1 represents a prior art type of buffer; and
FIG. 2 shows the preferred embodiment of the present invention.

DETAILED DESCRIPTION OF A PREFERRED EMBODIMENT

FIG. 2 illustrates a circuit 30 according to the present invention. Circuit 30 receives an input at 32 and applies it to an input stage 34 which comprises transistors 36 and 38 which are enhancement mode devices, as are all of the other transistors illustrated in FIG. 2. Transistor 36 is a p-channel device and transistor 38 preferably is its corresponding n-channel device. Transistors 36, 38 form a CMOS pair. As with stage 14 of FIG. 1, the source-drain paths of transistors 36 and 38 are coupled in series between VCC and ground. Preferably transistor 38 is four or five times larger in channel width than transistor 36.

An output 40 of inverter stage 34 is applied to the gate electrodes of an n-channel transistor 42 and a CMOS pair of transistors 44, 46. Preferably, the channel width of transistors 44, 46 is small, illustratively 6 microns, whereas the width of n-channel transistor 42 illustratively will be about 120 microns. As a result, most of the gain of input stage 34 appearing on output node 40 will be directed to the gate electrode of transistor 42.

The source-drain path of transistor 42 is coupled at the drain to VCC and at the source to a node C. A further transistor 48 is also an n-channel device whose source-drain path couples node C to ground. The gate electrode of transistor 48 is not, however, coupled to node 40, but instead is driven by the input 32. Thus transistor 42, coupled as a source follower to the first inverter stage, provides substantial pull-up to enable node C to drive more capacitance than node 40 would be able to drive. Additionally, the delay between a rising transition at node 40 and the rising transition at node C will be small because transistor 42 is connected as a source follower. Thus, node C closely follows node 40 because source follower transistor 42 is large and has a high gain.

Node C drives an output inverter stage and is coupled to the gate electrode of a CMOS pair of transistors 50 and 52 whose source-drain paths are coupled in series between VCC and ground. A node D between the source of transistor 50 and the drain of transistor 52 provides the output to the capacitive load 54.

It is well known that an n-channel transistor has more gain than a p-channel transistor of the same size. With the large pull-up of transistor 42, transistors 50 and 52 in the output stage can be made larger than otherwise obtainable by the prior art circuit of FIG. 1. The larger width of transistors at this output stage will result in this stage having a faster operation than otherwise obtainable.

As mentioned, the source follower transistor 42 is an n-channel device. As such, it cannot pull up all the way to VCC, but instead rises to one threshold voltage lower than VCC. To allow the voltage at node C to rise all the way to VCC, it is preferred to include a p-channel transistor 56 having its drain coupled to VCC and its source coupled to node C. This device is not added for speed, but only to ensure that the voltage rises fully at node C. Thus, it can be a small transistor, having a channel width illustratively of 6 microns. It does not affect the delay between the input 32 and output node D. Transistors 44 and 46 provide an inverter stage to allow the voltage at its output node E, which is coupled to the gate electrode of transistor 56, to be the logic inverse of the state of node 40. Transistors 44, 46 can be small, illustratively with a channel width of six microns, and the current drawn by them is correspondingly small. It will be appreciated that the signal which turns on transistor 56 lags one transition behind the signal at node 40 which turns on source follower 42. This one transition is interposed by the inverter comprising transistors 44, 46.

Transistor 48 is included in the preferred embodiment to insure that when the input voltage at 32 is 2.0 volts, node C will be pulled all the way to ground. Thus, transistor 48 is an n-channel device which is gated by the input voltage on 32. The source-drain path of transistor 48 will insure that node C drops to ground during this condition. The benefit of this is that if the input voltage at 32 is at a TTL logic high of 2.0 volts, then the 0 volts at node C will insure that CMOS pair 50, 52 of the output inverter stage will draw no current.

Thus, the operation of the circuit of FIG. 2 ensures that the voltage at node C will either be ground (VSS) or VCC when the input voltage is high or low. Because of this, either transistor 50 or 52 will be off so there is no standby current consumed at the output stage.

It may be noted at this point that in comparing the present invention to the conventional circuit illustrated at FIG. 1, if the first inverter stage were to drive a second inverter stage of 120 microns total width (which is the width of transistor 42 in FIG. 2), then the following would be dictated. Because a p-channel device of a CMOS pair must be double the width of an n-channel device, the p-channel device would have a width of about 80 microns and the n-channel device would have a channel width of about 40 microns. The gain of this CMOS pair, arranged as an inverter, would be less than the gain of transistor 42 because the individual widths are smaller. Further, a p-channel device has about one-half of the gain of an n-channel device of the same width. Thus, the gain on pull-up of a CMOS pair connected as an inverter would be about one-third the gain of transistor 42, keeping the total channel width constant. Thus, the result of using an n-channel transistor rather than a CMOS inverter pair is to improve the pull-up by a factor of three.

Illustratively, transistor 36 can have a width of 24 and a length of 4; transistor 38 can have a width of 120 and a length of 3.5; transistor 48 can have a width of 80; transistor 50 can have a width of 120; and transistor 52 can have a width of 240 (all expressed in microns).

Using SPICE programming, the following Table I was generated which shows the standby current and delay times under various conditions. It will be seen that at a constant current of 0.3 milliamps, the circuit of FIG. 2 provides a 1 ns improvement on down-going transitions and 0.6 ns improvement on upward transitions when the current is kept at a constant 0.3 mA. On the other hand, by comparing the current drawn by the FIG. 1 circuit with that drawn by the FIG. 2 circuit at substantially constant input-output transition delays, it can be seen that the circuit of FIG. 2 draws 0.3 mA, whereas the circuit of FIG. 1 draws 0.6 mA. Thus, the performance of the preferred embodiment of the present invention is consistently better than that of FIG. 1 in terms of standby current and speed.

TABLE I

| circuit | current (mA) in first stage with input at 2.0 v | time (ns) from input high to low crossing 1.4 v to output crossing 2.5 v | time (ns) from input low to high crossing 1.4 v to output crossing 2.5 v |
| --- | --- | --- | --- |
| FIG. 1 | 0.3 | 4.2 | 4.0 |
| FIG. 1 | 0.6 | 3.1 | 3.4 |
| FIG. 2 | 0.3 | 3.2 | 3.4 |
| FIG. 2 | 0.6 | 2.9 | 2.6 |

Variations can be made in the embodiment shown and described herein. Transistor 48 could be eliminated, if one were content to allow the output stage to draw higher standby current. Similarly, transistors 44, 46 and 56 can be eliminated with the same result. Other variations, modifications and embellishments can be made within the scope of this invention.

I claim:

1. A CMOS input buffer circuit comprising:
   a CMOS inverter input stage including an input for receiving a TTL signal;
   a CMOS inverter output stage including an input and an output; and
   an n-channel field effect transistor coupled as a source follower to said input stage and coupled to drive said output stage said output stage not being driven directly by said TTL signal, wherein said buffer circuit receives TTL signals and converts them to CMOS levels provided at said output of said output stage.

2. The circuit of claim 1 further including a p-channel field effect transistor coupled between a source of operating voltage and said input of said output stage, and being gated by a CMOS signal having the same logic value as said TTL signal, and being coupled to be turned on after said n channel source follower transistor turns on.

3. The circuit according to claim 2 further including a further inverter coupled to said input stage and providing an output coupled to the gate electrode of said p-channel transistor.

4. The circuit according to claim 3 wherein said further inverter comprises a pair of CMOS transistors.

5. The circuit according to claim 1 further including a further n-channel transistor coupling the source of said source follower transistor to a reference voltage.

6. The circuit according to claim 5 wherein said further n-channel transistor is gated by said TTL signal received at said input.

7. The circuit according to claim 5 wherein said further n-channel transistor includes a source-drain path which couples ground to the source of the source follower transistor.

8. The circuit according to claim 1 wherein said CMOS inverter input stage includes an n-channel and a p-channel pair of transistors, wherein the n-channel transistor is about 4 or 5 times larger than the p-channel transistor in channel width.

9. The circuit according to claim 2 further including a further n-channel transistor coupling a reference voltage to the source of said source follower transistor, and being gated by said TTL signal received at said input.

10. The circuit according to claim 9 wherein said transistors are enhancement mode devices.

11. The circuit according to claim 9, wherein said source follower transistor includes a gate electrode coupled to receive an inverted output from said inverter input stage, said source follower transistor providing an amplified output; and wherein said output stage inverter includes a CMOS pair of FETs each having a gate electrode, the source of said source follower transistor being coupled to said gate electrodes.

12. The circuit according to claim 1 wherein said output stage inverter includes a CMOS pair of FETs each having a gate electrode, the source of said source follower transistor being coupled to said gate electrodes.

13. The circuit of claim 12 further including a p-channel FET coupled to said input stage and having a source-drain path coupled between VCC and the gate electrodes of said output stage FETS.

14. The circuit of claim 13 wherein said p-channel FET is coupled to said input stage by a further inverter circuit.

15. The circuit of claim 12 including a further n-channel FET coupled to said input and including a source-drain path coupled between ground and said gate electrodes of said output stage.

16. An input buffer circuit for a CMOS semiconductor memory comprising:

an input stage inverter means for receiving an input TTL logic level signal and providing an inverted output;
a source follower FET coupled to receive said output and provide an amplified signal; and
an output stage inverter means for receiving said output from said source follower for inverting said signal and for providing a CMOS level buffered output signal, wherein the load driven by said input stage means consists essentially of said source follower, said output inverter means not being driven directly by said TTL signal.

17. The circuit according to claim 16 wherein said source follower comprises an n-channel transistor.

18. A buffer circuit comprising:
a buffer input;
a first CMOS inverter having an input coupled between said buffer input and providing an output driving a load;
said load comprising an n-channel field effect transistor coupled as a source follower to said first CMOS inverter and having the largest channel width of all devices in said load;
a node coupled to said source follower;
a p-channel transistor coupled to said node and having a gate electrode coupled to receive a signal having the same logic value as the signal applied to said buffer input, being coupled to turn on after said n-channel source follower transistor turns on, and having a source-drain path coupled between a source of operating voltage and said node;
a second CMOS inverter having an input coupled to said node and providing an output signal;
wherein a TTL signal coupled to said buffer input is inverted by said first inverter which drives said n-channel transistor to develop an inverted high gain signal on said node which is inverted by said second inverter to provide a CMOS level buffered output.

19. The buffer circuit of claim 18 wherein said load further comprises a third inverter coupled between the gate of said p-channel transistor and the output of said first inverter, the transistors of said third inverter having channel widths smaller than said channel width of said n-channel transistor, wherein said load consists essentially of said n-channel transistor.

20. The buffer circuit of claim 18 wherein said second inverter is coupled not to be driven directly by the signal received at said buffer input.

* * * * *